United States Patent
Smith et al.

(10) Patent No.: US 11,002,804 B1
(45) Date of Patent: May 11, 2021

(54) MAGNETIC FIELD SENSOR COMPENSATION METHODS AND SYSTEMS

(71) Applicant: HONEYWELL INTERNATIONAL INC., Morris Plains, NJ (US)

(72) Inventors: Douglas Smith, Phoenix, AZ (US); Paul Schwerman, Phoenix, AZ (US); Terry Ahrendt, Mesa, AZ (US)

(73) Assignee: HONEYWELL INTERNATIONAL INC., Charlotte, NC (US)

( * ) Notice: Subject to any disclaimer, the term of this patent is extended or adjusted under 35 U.S.C. 154(b) by 0 days.

(21) Appl. No.: 16/742,640

(22) Filed: Jan. 14, 2020

(51) Int. Cl.
  *G01R 33/00* (2006.01)
  *G01R 33/07* (2006.01)
  *G01R 15/20* (2006.01)

(52) U.S. Cl.
  CPC ....... *G01R 33/0029* (2013.01); *G01R 15/202* (2013.01); *G01R 33/07* (2013.01)

(58) Field of Classification Search
  CPC ... G01R 33/0029; G01R 15/202; G01R 33/07
  USPC ........................ 324/251, 244, 200
  See application file for complete search history.

(56) References Cited

U.S. PATENT DOCUMENTS

| | | | |
|---|---|---|---|
| 3,566,143 A * | 2/1971 | Paine | H02J 7/34 307/126 |
| 7,279,885 B2 | 10/2007 | Yakymyshyn et al. | |
| 7,622,910 B2 | 11/2009 | Kojori | |
| 7,923,996 B2 | 4/2011 | Doogue et al. | |
| 8,604,777 B2 | 12/2013 | Doogue et al. | |
| 8,624,587 B2 | 1/2014 | Popovic et al. | |
| 8,907,656 B2 | 12/2014 | Chen | |
| 8,907,669 B2 | 12/2014 | Petrie | |
| 9,966,882 B2 | 5/2018 | Williams et al. | |
| 10,309,992 B2 | 6/2019 | Peczalski et al. | |

(Continued)

FOREIGN PATENT DOCUMENTS

| | | |
|---|---|---|
| DE | 102012104348 A1 | 11/2013 |
| EP | 2202527 A1 | 6/2010 |

OTHER PUBLICATIONS

Liu, Ji-Gou, et al., "Error Compensation of Closed Loop Hall Effect Current Sensors," 2012 IEEE International Workshop on Applied Measurements for Power Systems, Aachen, Germany, Sep. 26-28, 2012.

(Continued)

*Primary Examiner* — Giovanni Astacio-Oquendo
(74) *Attorney, Agent, or Firm* — Lorenz & Kopf, LLP

(57) ABSTRACT

Sensing systems and methods are provided for compensating for offset and gain changes. A sensing system includes a magnetic element, a current sensing arrangement to provide a current measurement signal influenced by a flux induced in the magnetic element, an oscillator arrangement to provide a reference oscillating current signal configured to induce an oscillating flux in the magnetic element, and a compensation arrangement coupled the current sensing arrangement to adjust the current measurement signal to compensate for gain changes in the measurement signal output and provide a compensated current measurement based at least in part on the adjusted measurement signal and the reference oscillating current signal. The oscillating flux influences the current measurement signal output by the current sensing arrangement.

20 Claims, 2 Drawing Sheets

(56) References Cited

U.S. PATENT DOCUMENTS

2014/0312892 A1* 10/2014 Lenhard ................ G01R 33/02
324/244
2015/0042325 A1* 2/2015 Snoeij ................ G01R 19/0092
324/251

OTHER PUBLICATIONS

Pastre, Marc, "A Hall Sensor Analog Front End for Current Measurement with Continuous Gain Calibration," IEEE Sensors Journal, vol. 7, No. 5, May 2007.
Duric, Radivoje, et al., "Self-Oscillating Fluxgate Current Sensor with Pulse Width Modulated Feedback," Electronics, vol. 14, No. 2, Dec. 2010.
Kumar, Ashish and John, Vinod (2013) Compensator Design for Closed Loop Hall-Effect Current Sensors. In: National Power Electronics Conference, Dec. 20-22, 2013, IIT Kanpur, Kanpur, India.

* cited by examiner

— MAGNETIC FIELD SENSOR COMPENSATION METHODS AND SYSTEMS

TECHNICAL FIELD

The subject matter described herein relates generally to sensing systems, and more particularly, embodiments of the subject matter relate to gain and offset compensation for magnetic field sensing elements.

BACKGROUND

Hall effect sensors are commonly used to provide current sensing and/or magnetic position sensing. One advantage associated with Hall effect sensors is magnetic isolation between higher power electronics and the lower power signal conditioning circuits. This isolation provides for greatly reduced noise coupling and increased reliability in harsh environments where other sensors may not be usable, due to temperature, external noise, vibrations, or the like. For example, resistive current sensing techniques may be susceptible to a relatively large common mode voltage resulting from electrical noise. Optical sensing techniques often rely on sensitive optical components, which may be inappropriate for harsh operating environments. However, Hall effect sensors can be susceptible to radiation induced signal errors. Accordingly, it is desirable to provide compensation methods and systems to improve performance in radiative environments.

BRIEF SUMMARY

Sensing systems and related compensation methods are provided. An exemplary sensing system includes a magnetic element, a current sensing arrangement to provide a current measurement signal influenced by a flux induced in the magnetic element, an oscillator arrangement to provide a reference oscillating current signal configured to induce an oscillating flux in the magnetic element, and a compensation arrangement coupled the current sensing arrangement to adjust the current measurement signal to compensate for gain changes in the measurement signal output and provide a compensated current measurement based at least in part on the adjusted measurement signal and the reference oscillating current signal, wherein the oscillating flux influences the current measurement signal output by the current sensing arrangement.

In another embodiment, a method is provided for measuring a current flow through a conductor using a magnetic element substantially circumscribing the conductor such that a magnetic flux within the magnetic element is influenced by the current flow through the conductor. The method involves injecting a reference oscillating magnetic flux into the magnetic element, the reference oscillating magnetic flux influencing the magnetic flux within the magnetic element, obtaining a measurement signal output from a sensing arrangement, the measurement signal being influenced by the magnetic flux, determining a gain factor associated with the sensing arrangement based on a portion of the measurement signal attributable to the reference oscillating magnetic flux, subtracting the portion of the measurement signal attributable to the reference oscillating magnetic flux from the measurement signal to obtain a measurement portion of the measurement signal corresponding to the current flow through the conductor, and determining a current measurement value for the current flow based on the measurement portion of the measurement signal.

Another embodiment of a sensing system includes a magnetic core having an air gap and a current sensing arrangement comprising a first Hall effect sensing element disposed within the air gap and a second Hall effect sensing element disposed within the air gap, wherein the first Hall effect sensing element and the second Hall effect sensing element are arranged to have opposite polarity. An oscillator arrangement provides a reference oscillating current signal configured to induce an oscillating flux in the magnetic core, with the first Hall effect sensing element providing a first measurement signal influenced by the oscillating flux and the second Hall effect sensing element providing a second measurement signal influenced by the oscillating flux. A compensation arrangement is coupled the current sensing arrangement to obtain a current measurement signal comprising a sum of the first measurement signal and an inverse of the second measurement signal, determine current gain factor associated with the current sensing arrangement based on a portion of the current measurement signal attributable to the oscillating flux, adjust the current measurement signal based on the current gain factor and provide a corrected measurement signal by subtracting the reference oscillating current signal from the adjusted current measurement signal.

BRIEF DESCRIPTION OF THE DRAWINGS

Embodiments of the subject matter will hereinafter be described in conjunction with the following drawing figures, wherein like numerals denote like elements, and.

DETAILED DESCRIPTION

Figure 1:
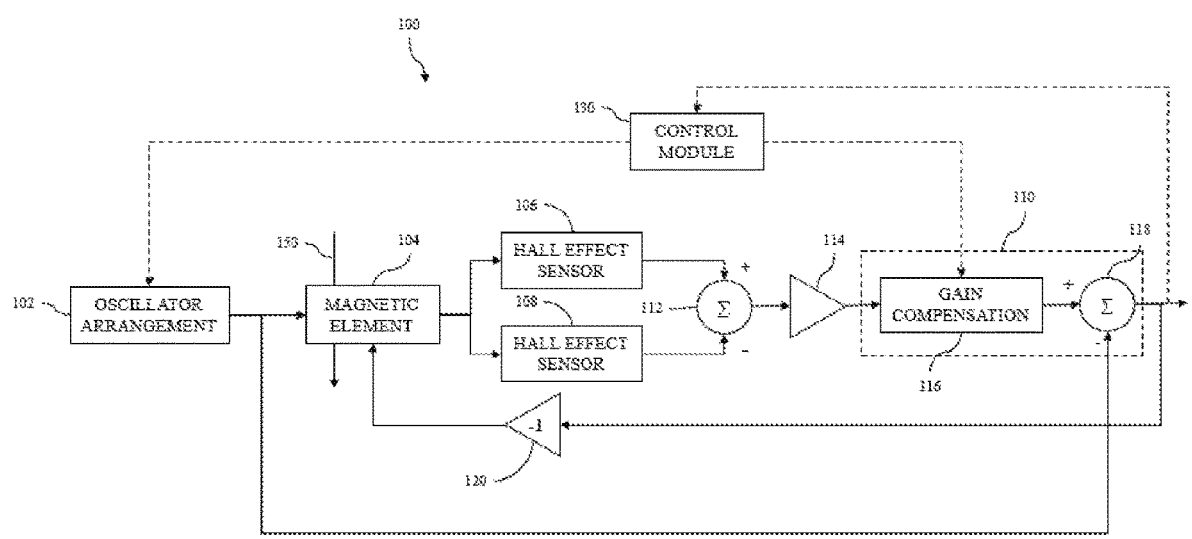
FIG. 1 is a block diagram of a sensing system in an exemplary embodiment.

Embodiments of the subject matter described herein generally relate to systems and methods for providing compensated current measurements to reduce signal errors due to drift or other changes to the gain or offset associated with a sensing element. While the subject matter described herein could be utilized in various applications or in the context of various different types of vehicles (e.g., automobiles, marine vessels, trains, or the like), exemplary embodiments are described herein primarily in the context of sensors located onboard or otherwise associated with a spacecraft, aircraft, or other agile vehicle that may be operated in a harsh operating environment. For example, the subject matter described herein may be implemented in connection with current sensors located onboard a satellite. That said, other potential applications include, but are not limited to, position sensing applications including permanent magnet motors, torque motors, and/or solenoids, or current sensing applications including power supplies, power distribution systems, electronic controllers used in hydraulic, pneumatic, and electro-mechanical actuation systems, and/or electrically driven valves.

As described in greater detail below, embodiments of the subject matter described herein allow for real-time on-the-fly compensation or calibration of current sensor measurements to correct for gain and/or offset errors. For example, when a Hall effect current sensor or other magnetic field sensor is employed on a spacecraft, long-term radiation exposure in space may influence the gain or produce an offset that would otherwise result in measurement error. In exemplary embodiments, a reference oscillating signal utilized to dither the magnetic flux through a magnetic current sensing arrangement to influence the current measurement signal output. A compensation arrangement adjusts the current measurement signal to compensate for gain changes in the measurement signal output and subtracts the reference oscillating signal from the adjusted measurement signal to obtain a compensated current measurement that mitigates the impact of changes to the gain of the current sensing arrangement. By virtue of knowledge of the amplitude of the oscillating signal used to dither the magnetic flux, the gain of the current sensing arrangement can be reliably determined, with the reference oscillating signal then being subtracted from the gain-adjusted measurement signal to obtain a corrected measurement signal that reflects the measured current and accounts for gain changes. In this regard, in exemplary embodiments, the reference oscillating signal is generated or otherwise provided using a stable oscillator circuit that is not susceptible to radiation effects, such as, for example, a scalene oscillator. Additionally, in some exemplary embodiments, an antipolar, inverted or back-to-back configuration of two current sensing arrangements with opposing magnetic polarity orientations are utilized to obtain respective current measurement signals that are combined in a manner that mitigates any unidirectional direct current (DC) offset or drift in the measurement signal output over time. Thus, the corrected output measurement signal may be immune to both gain changes and offset drift.

FIG. 1 depicts an exemplary embodiment of a sensing system that includes, without limitation, an oscillator arrangement 102, a magnetic element 104, one or more current sensing arrangements 106, 108, and a current compensation arrangement 110. In exemplary embodiments, the magnetic element 104 is arcuate or annular and disposed about a conductor 150, with the current sensing arrangements 106, 108 being configured to measure or otherwise sense the amount of current flow through the conductor 150 based in the magnetic flux induced within the magnetic element 104. In this regard, in the illustrated embodiment, the sensing system 100 is configured to provide closed-loop compensation to increase dynamic range of the sensing arrangements 106, 108 by providing a feedback compensation signal through a feedback coil or windings that are configured to produce magnetic flux through the magnetic element 104 that counters the magnetic flux caused by the current flow through the conductor 150 to prevent saturation of the sensing arrangements 106, 108.

It should be appreciated that FIG. 1 is a simplified representation of a sensing system 100 for purposes of explanation and is not intended to be limiting. In this regard, practical embodiments of the sensing system 100 may include analog-to-digital converters, digital-to-analog converters, and the like to convert between digital and analog domains as will be appreciated in the art. Moreover, it should be appreciated that various elements of the sensing system 100 could be implemented using discrete components, integrated circuits, or combinations thereof.

In exemplary embodiments, the oscillator arrangement 102 is realized as a current source capable of producing an alternating current (AC) signal. As described in greater detail below in the context of FIG. 2, the oscillator arrangement 102 provides a reference oscillating current signal through an injection coil or windings, which are configured or otherwise arranged with respect to the magnetic element 104 to produce an oscillating magnetic flux within the magnetic element 104, thereby effectively dithering the feedback compensation signal. In some embodiments, the injection coil may be separate from the coil or windings utilized to carry the feedback compensation signal, while in other embodiments the reference oscillating current signal may be summed or otherwise combined with the feedback compensation signal before the dithered feedback compensation signal is provided through the feedback coil or windings. In one embodiment, the oscillator arrangement 102 is realized as a scalene oscillator configured to provide an asymmetrical oscillating triangle wave with a rise time different from the fall time. That said, the subject matter described herein is not limited to use with a scalene oscillator and could be implemented using any sort of stable oscillator circuitry that is not susceptible to radiation.

The magnetic element 104 has an arcuate or annular shape having a central opening configured to substantially circumscribe a wire or similar conductor to facilitate non-contact measurements of a current flow through the conductor 150. In this regard, current flow through the conductor 150 generates a magnetic field that induces a magnetic flux within the magnetic element 104. For purposes of explanation, the magnetic element 104 may alternatively be referred to herein as a magnetic core. In exemplary embodiments, the magnetic core 104 includes an air gap where a magnetic sensing element may be arranged to sense or measure the air gap magnetic field. That is, the magnetic core 104 may be C-shaped with the air gap being provided by the absence of an arcuate portion that would otherwise complete a circle or ring, with the magnetic sensing elements provided within the air gap created by that voided arcuate portion.

The current sensing arrangements 106, 108 generally represent the hardware and/or circuitry components that are configured to generate output current measurement signals that are influenced by the magnetic flux within the magnetic core 104. In this regard, each of the current sensing arrangements 106, 108 includes or is realized as a magnetic sensing element that is disposed within the air gap of the magnetic core 104 to measure the air gap magnetic field generated in response to the magnetic flux through the magnetic core 104. For example, in exemplary embodiments, the current sensing arrangements 106, 108 are realized as Hall effect current sensors that include a Hall element that is inserted in the air gap and produces a voltage in response to the air gap magnetic field. In this regard, the magnitude of the voltage signal generated by a respective Hall element is proportional to the strength of the air gap magnetic field, which, in turn, is proportional to the amount of current flowing through the conductor 150. Accordingly, the voltage signal output or otherwise provided by the current sensing arrangements 106, 108 functions as a current measurement signal. For purposes of explanation, the current sensing arrangements 106, 108 may alternatively be referred to herein as Hall effect current sensors.

In exemplary embodiments, the Hall effect current sensors 106, 108 substantially identical to one another, such that they produce an output voltage signal having substantially the same magnitude in response to the same air gap magnetic field. The Hall effect current sensors 106, 108 are inverted, physically and/or electromagnetically, with respect to one another or are otherwise arranged such that the air gap magnetic field results in one Hall effect current sensor 106 providing an output voltage having opposite polarity of the output voltage provided by the other Hall effect current sensor 108. For example, a first Hall effect current sensor 106 may be mounted or otherwise provided on one side of a electronics substrate provided within the air gap of the magnetic core 104, while the other Hall effect current sensor 108 is mounted or otherwise provided on the opposing side of the electronics substrate and faces the magnetic core 104 in a direction opposite the other Hall effect current sensor 106. In this configuration, the Hall effect current sensors 106, 108 may be understood to be in an antipolar configuration.

The illustrated sensing system 100 includes a summation block 112 coupled to the outputs of the Hall effect current sensors 106, 108 to receive the current measurement signals and add or otherwise combine the current measurement signals to arrive at a combined current measurement signal. In this regard, by virtue of the antipolar configuration of the Hall effect current sensors 106, 108, the output of the second Hall effect sensor 108 is inverted prior to being added to or otherwise combined with the output measurement signal from the first Hall effect sensor 106. For example, the voltage output by the first Hall effect current sensor 106 may be added to the inverted voltage output provided by the antipolar Hall effect current sensor 108, such that the resultant voltage output generated by the summation block 112 corresponds to double the amount of the voltage that would normally be produced by an individual Hall effect current sensor 106, 108 for a given amount of current through the magnetic core 104. The output of the summation block 112 may be provided to an amplification block 114 that is configured to adjust the magnitude of the combined current measurement signal prior to performing gain compensation. For example, the amplification block 114 may be configured as a voltage divider to divide the combined measurement signal by a factor of 2, thereby effectively averaging the output measurement signals from the Hall effect current sensors 106, 108.

The antipolar configuration and summation of the output signals of the Hall effect current sensors 106, 108 compensate for unidirectional DC offset or drift in the measurement signal output over time. For example, radiation or other environmental factors or aging may affect the output voltages generated by the Hall effect current sensors 106, 108 in a substantially equivalent manner to cause the electrical offset to shift or drift in the same polarity direction. Thus, even though the Hall effect current sensors 106, 108 may be physically inverted with respect to each other, the electrical offset shift will have the same polarity in each device. Therefore, the summation block 112 may cancel out the unwanted offset DC bias. That said, it should be appreciate the gain compensation techniques described herein are not limited to use with the antipolar configuration for offset compensation, and accordingly, practical embodiments of the sensing system 100 may include only a single Hall effect current sensor 106, in which case the second Hall effect current sensor 108, the summation block 112, and/or the amplification block 114 need not be present.

The current compensation arrangement 110 generally represents the hardware, circuitry, logic and/or software components that are configured to compensate for changes to the gain of the Hall effect current sensors 106, 108 and provide a gain-compensated current measurement signal. In this regard, the current compensation arrangement 110 utilizes knowledge of the magnitude or other characteristics of the reference oscillating signal provided by the oscillator arrangement 102 to calculate or otherwise determine, in real-time, the gain of the Hall effect current sensors 106, 108 based on the relationship between the current measurement signal input to the current compensation arrangement 110 and the reference oscillating signal. It should be noted that the current compensation arrangement 110 may also compensate for changes to the offset exhibited by the Hall effect current sensors 106, 108.

Figure 2:
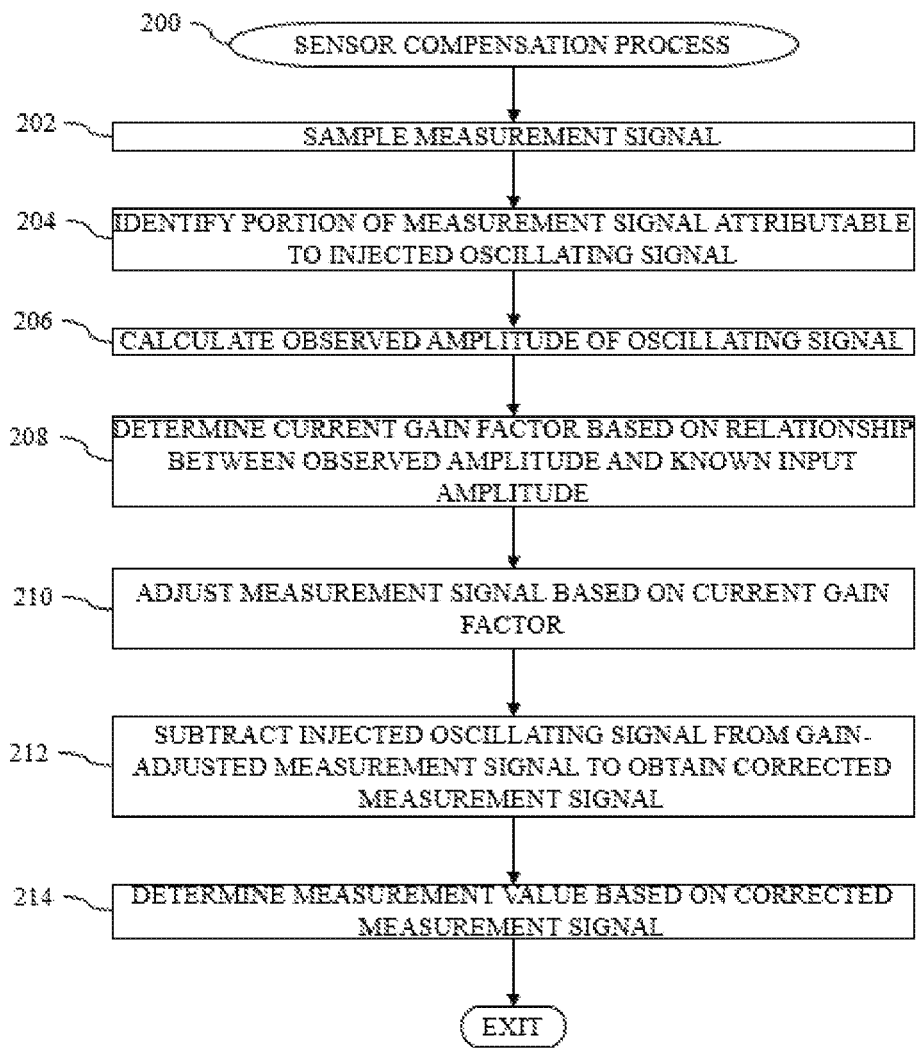
FIG. 2 is a flow diagram of an exemplary sensor compensation process suitable for implementation by or in conjunction with the sensing system of FIG. 1 in accordance with one or more exemplary embodiments.

In exemplary embodiments, the current compensation arrangement 110 includes a gain compensation block 116 that calculates or otherwise determines an observed gain of the Hall effect current sensors 106, 108 by filtering or otherwise extracting the portion of the measurement signal voltage input to the gain compensation block 116 that is attributable to the reference oscillating signal based on characteristics of the reference oscillating signal (e.g., frequency, magnitude, waveform, etc.), as described in greater detail below in the context of FIG. 2. In this regard, in exemplary embodiments, the gain compensation block 116 is implemented using digital circuits and includes an analog-to-digital conversion arrangement configured to convert the input measurement voltage into a digital measurement value (or digital measurement signal). The gain compensation block 116 calculates or otherwise determines the gain of the Hall effect current sensors 106, 108 based on the relationship between the portion of the measurement signal attributable to the reference oscillating signal and the knowledge of the magnitude of the reference oscillating signal, for example, by dividing the amplitude of the voltage measurement corresponding to the reference oscillating signal by the amplitude of the reference oscillating current signal. Based on the relationship between the observed gain and a nominal or reference gain for the Hall effect current sensors 106, 108, the gain compensation block 116 generates a gain-adjusted measurement signal. For example, if the observed gain associated with the Hall effect current sensors 106, 108 is determined to be twice the nominal or reference gain of the Hall effect current sensors 106, 108 prior to radiation exposure, the gain compensation block 116 may divide the measurement signal input to the gain compensation block 116 in half Thus, the adjusted measurement signal output by the gain compensation block 116 is calibrated or otherwise compensates for changes in the gain of the Hall effect current sensors 106, 108.

Still referring to FIG. 1, the current compensation arrangement 110 includes a summation block 118 that is configured to subtract the reference oscillating signal from the gain-adjusted measurement signal to obtain a corrected gain-compensated measurement signal that does not include the dither introduced by the oscillating signal provided by the oscillator arrangement 102. In exemplary embodiments, the corrected gain-compensated measurement signal is provided to an inverter block 120 having an output coupled to a coil or windings about the magnetic core 104 to establish a feedback loop that provides closed-loop compensation for the magnetic flux through the magnetic core 104 to increase the dynamic range of the Hall effect current sensors 106, 108. In this regard, the inverter block 120 may include a digital-to-analog converter to convert a corrected gain-compensated measurement value into a corresponding analog electrical current signal, with the feedback coil and the inverter block 120 being cooperatively configured to provide a magnetic flux through the magnetic core 104 in the opposite direction of the magnetic flux caused by the current flow through the conductor 150.

It should be appreciated that the corrected gain-compensated measurement signal may be output or otherwise provided to any type and/or number of devices or components for performing actions or operations that are influenced by the amount of current flow through the conductor 150. For example, the conductor 150 may correspond to a current flow through a motor, where the corrected gain-compensated measurement signal is provided to a motor controller to adjust or otherwise alter the amount of current flow through the motor to adjust operation of the motor based on the measured current flow through the motor.

For purposes of illustration, the sensing system 100 includes a supervisory control module 130 that is coupled to the output of the current compensation arrangement 110 to receive or otherwise obtain the corrected gain-compensated current measurement. Additionally, in the illustrated embodiment, the control module 130 is coupled to the oscillator arrangement 102 to control, command, or otherwise operate the oscillator arrangement 102 to provide a reference oscillating current signal with the desired amplitude, frequency, waveform or shape, and/or the like. The control module 130 may also be coupled to the gain compensation block 116 to provide information characterizing the characteristics of the reference oscillating current signal (e.g., amplitude, frequency, waveform, etc.), which, in turn, may be utilized by the gain compensation block 116 to calculate or otherwise determine the observed gain of the Hall effect current sensors 106, 108 based on the relationship between the portion of the output voltage attributable to the dither flux in the magnetic core 104 resulting from the reference oscillating current signal and the characteristics of the reference oscillating current signal. In this regard, the control module 130 generally represents the hardware, software, and/or firmware component (or a combination thereof), which is communicatively coupled to other elements of the sensing system 100 and configured to support the subject matter described herein. It should be noted that the control module 130 could be realized as a motor control module or similar controller that performs other tasks, actions, or operations that influence the amount of current flow through the conductor 150. Moreover, in some embodiments, the features and/or functionality of one or more of the components of the sensing system 100 may be integrated with the control module 130. For example, the current compensation arrangement 110 could be implemented or otherwise integrated into a higher-level control module.

Depending on the embodiment, the control module 130 may be implemented or realized with a general-purpose processor, a content addressable memory, a digital signal processor, an application specific integrated circuit, a field programmable gate array, any suitable programmable logic device, discrete gate or transistor logic, processing core, discrete hardware components, or any combination thereof, designed to perform the functions described herein. The control module 130 may also be implemented as a combination of computing devices, e.g., a plurality of processing cores, a combination of a digital signal processor and a microprocessor, a plurality of microprocessors, one or more microprocessors in conjunction with a digital signal processor core, or any other such configuration. In practice, the control module 130 may include processing logic that may be configured to carry out the functions, techniques, and processing tasks associated with the operation of the system 100, as described in greater detail below. Furthermore, the steps of a method or algorithm described in connection with the embodiments disclosed herein may be embodied directly in hardware, in firmware, in a software module executed by the control module 130, or in any practical combination thereof. In such embodiments, the control module 130 may include or otherwise access a data storage element (or memory) capable of storing code or other computer-executable programming instructions that, when read and executed by the control module 130, cause the control module 130 to support or otherwise perform certain tasks, operations, functions, and/or processes described herein.

FIG. 2 depicts an exemplary embodiment of a sensor compensation process 200 suitable for use in the sensing system 100 of FIG. 1 to accurately and reliably measure current flow through a conductor 150 in a non-contact manner with reduced susceptibility to gain or offset changes over time. The various tasks performed in connection with the illustrated process 200 may be implemented using hardware, firmware, software executed by processing circuitry, or any combination thereof. For illustrative purposes, the following description may refer to elements mentioned above in connection with FIG. 1. In practice, portions of the sensor compensation process 200 may be performed by different elements of the sensing system 100; that said, for purposes of explanation, the sensor compensation process 200 may be described herein in context of being performed primarily by the current compensation arrangement 110 and/or the control module 130. It should be appreciated that the sensor compensation process 200 may include any number of additional or alternative tasks, the tasks need not be performed in the illustrated order and/or the tasks may be performed concurrently, and/or the sensor compensation process 200 may be incorporated into a more comprehensive procedure or process having additional functionality not described in detail herein. Moreover, one or more of the tasks shown and described in the context of FIG. 2 could be omitted from a practical embodiment of the sensor compensation process 200 as long as the intended overall functionality remains intact.

The sensor compensation process 200 begins by sampling or otherwise obtaining the measurement signal output by the sensing arrangement (task 202). In this regard, the current compensation arrangement 110 may periodically sample the measurement signal output by the amplification block 114 that represents the sum of the measurement signals output by the antipolar Hall effect sensors 106, 108. As described above, the measurement signals output by the Hall effect sensors 106, 108 are correlative to or otherwise indicative of the magnetic flux induced with in the magnetic core 104 by the current flow through the conductor 150 as well as the oscillating magnetic flux induced by the reference oscillating current signal provided by the oscillator arrangement 102 and the feedback magnetic flux provided via the inverter arrangement 120. In exemplary embodiments, the sampling frequency at which the current compensation arrangement 110 samples the measurement signal output is at least twice the frequency of the reference oscillating current signal provided by the oscillator arrangement 102, which, in turn, is at least twice the frequency of the current flow through the conductor 150. For example, in one embodiment, sampling frequency employed by the current compensation arrangement 110 is more than ten times the dither frequency (e.g., a 20 kHz sampling frequency to measure an alternating current flow through the conductor 150 having a frequency below 500 Hz with the dither frequency for the reference oscillating current signal of 1 kHz).

The sensor compensation process 200 continues by identifying or otherwise determining the portion of the measurement signal output that is attributable to the injected oscillating signal (task 204). For example, the digital gain compensation block 116 may utilize a high-pass filter to remove portions of the measurement signal attributable to the current flow through the conductor 150 or feedback current and identify the amplitude of the remaining portion of the measurement signal attributable to the injected oscillating magnetic flux. That said, the subject matter described herein is not limited to high-pass filtering and other techniques for analyzing the spectral composition of signals may be utilized. Based on the portion of the measurement signal attributable to the oscillating signal, the sensor compensation process 200 calculates or otherwise determines an observed or measured amplitude for the oscillating signal, and then calculates or otherwise determines the current gain factor for the sensing arrangement based on the relationship between the observed amplitude and the known reference amplitude for the oscillating signal (tasks 206, 208). For example, the digital gain compensation block 116 may divide the measured portion of the measurement signal attributable to the injected oscillating magnetic flux by a nominal or reference gain for the Hall effect sensors 106, 108 to obtain an estimate of the observed amplitude of the oscillating current signal generated by the oscillator arrangement 102. The ratio or relationship between the observed amplitude of the oscillating current signal and the known amplitude of the oscillating current signal generated by the oscillator arrangement 102 may then be utilized to scale or otherwise adjust the nominal or reference gain for the Hall effect sensors 106, 108 to obtain the current gain factor for the Hall effect sensors 106, 108. For example, if the observed amplitude of the oscillating current signal is twice or double what the known amplitude of the oscillating current signal is, the nominal or reference gain for the Hall effect sensors 106, 108 may be correspondingly doubled to arrive at the current gain for the Hall effect sensors 106, 108.

After determining the current gain factor, the illustrated sensor compensation process 200 adjusts the measurement signal to obtain a gain-adjusted measurement signal (task 210). For example, the digital gain compensation block 116 may divide the voltage measurement signal provided at its input by the current gain factor to obtain a gain-adjusted measurement signal. Thereafter, the sensor compensation process 200 subtracts the injected reference oscillating signal from the gain-adjusted measurement signal to obtain a corrected measurement signal that does not include the injection signal and compensated for gain changes (task 212). For example, as depicted in FIG. 1, the output of the oscillator arrangement 102 may be subtracted from the gain-adjusted measurement signal output by the gain compensation block 116 by the summation block 118. The corrected measurement signal may be fed back to the magnetic core 104 via the inverter arrangement 120 to provide closed-loop compensation to prevent saturation and increase the dynamic range of the Hall effect sensors 106, 108, as described above. In this regard, the feedback current signal attempts to reduce the amount of magnetic flux within the magnetic core 104 to zero, with the magnetic core 104 effectively functioning as a summer that produces a cumulative magnetic flux that is influenced by the feedback current signal, the reference oscillating signal, and the current signal of interest flowing through the conductor 150. Additionally, the corrected gain-adjusted measurement signal may be utilized to calculate or otherwise determine a corresponding digital measurement value for the current flow through the conductor (task 214), for example, by utilizing an analog-to-digital converter to convert the corrected gain-adjusted measurement signal to a digital current measurement value to be analyzed by the control module 130 or other control system (e.g., by a motor controller to adjust operation of the motor based on the measured current flow to the motor via the conductor 150).

To briefly summarize, the subject matter described herein allows for accurate and reliable non-contact measurements to be obtained in harsh operating environments where radiation exposure could otherwise cause gain changes or introduce offsets that otherwise impair measurement accuracy, signal-to-noise ratio, and/or the like. For the sake of brevity, conventional techniques related to sensors, electromagnetics, Hall effect sensors, and other functional aspects of the systems (and the individual operating components of the systems) may not be described in detail herein. Furthermore, the connecting lines shown in the various figures contained herein are intended to represent exemplary functional relationships and/or physical couplings between the various elements. It should be noted that many alternative or additional functional relationships or physical connections may be present in an embodiment of the subject matter.

The subject matter may be described herein in terms of functional and/or logical block components, and with reference to symbolic representations of operations, processing tasks, and functions that may be performed by various computing components or devices. It should be appreciated that the various block components shown in the figures may be realized by any number of hardware components configured to perform the specified functions. For example, an embodiment of a system or a component may employ various integrated circuit components, e.g., memory elements, digital signal processing elements, logic elements, look-up tables, or the like, which may carry out a variety of functions under the control of one or more microprocessors or other control devices. Furthermore, embodiments of the subject matter described herein can be stored on, encoded on, or otherwise embodied by any suitable non-transitory computer-readable medium as computer-executable instructions or data stored thereon that, when executed (e.g., by a processing system), facilitate the processes described above.

The foregoing description refers to elements or nodes or features being "coupled" together. As used herein, unless expressly stated otherwise, "coupled" means that one element/node/feature is directly or indirectly joined to (or directly or indirectly communicates with) another element/node/feature, and not necessarily mechanically. Thus, although the drawings may depict one exemplary arrangement of elements directly connected to one another, additional intervening elements, devices, features, or components may be present in an embodiment of the depicted subject matter. In addition, certain terminology may also be used herein for the purpose of reference only, and thus are not intended to be limiting.

The foregoing detailed description is merely exemplary in nature and is not intended to limit the subject matter of the application and uses thereof. Furthermore, there is no intention to be bound by any theory presented in the preceding background, brief summary, or the detailed description.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the subject matter in any way. Rather, the foregoing detailed description will provide those skilled in the art with a convenient road map for implementing an exemplary embodiment of the subject matter. It should be understood that various changes may be made in the function and arrangement of elements described in an exemplary embodiment without departing from the scope of the subject matter as set forth in the appended claims. Accordingly, details of the exemplary embodiments or other limitations described above should not be read into the claims absent a clear intention to the contrary.

What is claimed is:

1. A sensing system comprising:
   a magnetic element;
   a current sensing arrangement to provide a current measurement signal influenced by a flux induced in the magnetic element;
   an oscillator arrangement to provide a reference oscillating current signal configured to induce an oscillating flux in the magnetic element, the oscillating flux influencing the current measurement signal output by the current sensing arrangement; and
   a compensation arrangement coupled the current sensing arrangement to adjust the current measurement signal to compensate for gain changes in the current measurement signal and provide a compensated current measurement based at least in part on the adjusted current measurement signal and the reference oscillating current signal.

2. The system of claim 1, wherein the current sensing arrangement comprises a first Hall effect sensing element.

3. The system of claim 2, wherein the current sensing arrangement comprises a second Hall effect sensing element configured antipolar to the first Hall effect sensing element.

4. The system of claim 3, wherein the current measurement signal comprises a sum of a first measurement output signal from the first Hall effect sensing element and an inverse of a second measurement output signal from the second Hall effect sensing element.

5. The system of claim 3, wherein the first Hall effect sensing element and the second Hall effect sensing element are disposed within an air gap provided by the magnetic element.

6. The system of claim 3, wherein the current sensing arrangement comprises a second Hall effect sensing element inverted with respect to the first Hall effect sensing element to compensate for a direct current (DC) offset.

7. The system of claim 1, wherein the oscillator arrangement is coupled to a coil about the magnetic element and provides the reference oscillating current signal through the coil to induce the oscillating flux.

8. The system of claim 7, further comprising a second coil about the magnetic element, wherein:
   the compensation arrangement is coupled to the second coil to provide a compensation current signal through the second coil; and
   the compensation current signal corresponds to an inverse of the compensated current measurement.

9. The system of claim 1, further comprising a coil wound about the magnetic element, wherein:
   the compensation arrangement is coupled to the coil to provide a compensation current signal through the coil; and
   the compensation current signal corresponds to an inverse of the compensated current measurement.

10. The system of claim 1, wherein the compensation arrangement is configured to identify a portion of the current measurement signal attributable to the oscillating flux, determining an observed amplitude for the reference oscillating current signal based on the identified portion of the current measurement signal, and determines a gain factor based on a relationship between the observed amplitude and a known amplitude for the reference oscillating current signal.

11. The system of claim 10, wherein the compensation arrangement is configured to adjust the current measurement signal to compensate for gain changes by scaling the current measurement signal in accordance with a second relationship between the gain factor and a reference gain factor.

12. The system of claim 11, wherein:
   the scaling results in a gain-adjusted current measurement signal; and
   the compensation arrangement is configured to subtract the reference oscillating current signal from the gain-adjusted current measurement signal prior to providing the compensated current measurement.

13. A method of measuring a current flow through a conductor using a magnetic element substantially circumscribing the conductor such that a magnetic flux within the magnetic element is influenced by the current flow through the conductor, the method comprising:
   injecting a reference oscillating magnetic flux into the magnetic element, the reference oscillating magnetic flux influencing the magnetic flux within the magnetic element;
   obtaining a measurement signal output from a sensing arrangement, the measurement signal being influenced by the magnetic flux;
   determining a gain factor associated with the sensing arrangement based on a portion of the measurement signal attributable to the reference oscillating magnetic flux;
   subtracting the portion of the measurement signal attributable to the reference oscillating magnetic flux from the measurement signal to obtain a measurement portion of the measurement signal corresponding to the current flow through the conductor; and
   determining a current measurement value for the current flow based on the measurement portion of the measurement signal.

14. The method of claim 13, further comprising identifying the portion of the measurement signal based on a frequency associated with the reference oscillating magnetic flux.

15. The method of claim 14, wherein injecting the reference oscillating magnetic flux comprises an oscillator arrangement providing a reference oscillating current signal having the frequency through a coil wound about the magnetic element.

16. The method of claim 13, the reference oscillating magnetic flux being induced by a reference oscillating current signal, wherein determining the gain factor comprises:
   determining an observed amplitude for the reference oscillating current signal based on the identified portion of the measurement signal attributable to the reference oscillating magnetic flux; and
   determining the gain factor based on a relationship between the observed amplitude and a known amplitude of the reference oscillating current signal.

17. The method of claim 16, further comprising adjusting the measurement signal to obtain a gain-adjusted measurement signal, wherein:
   subtracting the portion comprises subtracting the reference oscillating current signal from the gain-adjusted measurement signal to obtain a corrected measurement signal; and
   determining the current measurement value comprises determining the current measurement value based on the corrected measurement signal.

18. A sensing system comprising:
   a magnetic core having an air gap;
   a current sensing arrangement comprising a first Hall effect sensing element disposed within the air gap and a second Hall effect sensing element disposed within the air gap, wherein the first Hall effect sensing element and the second Hall effect sensing element are arranged to have opposite polarity;

an oscillator arrangement to provide a reference oscillating current signal configured to induce an oscillating flux in the magnetic core, the first Hall effect sensing element providing a first measurement signal influenced by the oscillating flux and the second Hall effect sensing element providing a second measurement signal influenced by the oscillating flux; and a compensation arrangement coupled the current sensing arrangement to obtain a current measurement signal comprising a sum of the first measurement signal and an inverse of the second measurement signal, determine current gain factor associated with the current sensing arrangement based on a portion of the current measurement signal attributable to the oscillating flux, adjust the current measurement signal based on the current gain factor and provide a corrected measurement signal by subtracting the reference oscillating current signal from the adjusted current measurement signal.

19. The sensing system of claim 18, wherein the oscillator arrangement comprises a scalene oscillator.

20. The sensing system of claim 18, wherein:
the magnetic core is configured to circumscribe a conductor carrying a current to be measured having a first frequency;
the reference oscillating current signal has a second frequency greater than the first frequency; and
the compensation arrangement is configured to sample the current measurement signal with a third frequency greater than the second frequency.

* * * * *